United States Patent [19]

Shipman

[11] B  4,001,659
[45]  Jan. 4, 1977

[54] APPARATUS FOR SPINNING A MICROELECTRONIC SUBSTRATE

[75] Inventor: Vern D. Shipman, Garland, Tex.

[73] Assignee: Headway Research, Inc., Garland, Tex.

[22] Filed: Sept. 12, 1974

[21] Appl. No.: 505,582

[44] Published under the second Trial Voluntary Protest Program on March 23, 1976 as document No. B 505,582.

[52] U.S. Cl. .............................. 318/119; 310/15; 310/36
[51] Int. Cl.[2] ..................................... H02K 33/00
[58] Field of Search ............. 318/35, 65, 119, 122, 318/126; 310/36, 15, 27, 38

[56] References Cited

UNITED STATES PATENTS

3,475,629  10/1969  Lagier .................................. 310/36

*Primary Examiner*—R. N. Envall, Jr.
*Attorney, Agent, or Firm*—Charles W. McHugh

[57] ABSTRACT

In the manufacture of semiconductor components thin films of submicron thickness are in widespread use. To produce the submicron thick films free of entrapped pockets of air, a platform, to which a substrate surface is mounted, is initially caused to oscillate in a shaking motion to produce a shearing force to lift minute pockets of air trapped at the liquid-substrate interface to permit migration to the surface of the liquid where they escape. This initial oscillating operation is provided by a permanent magnet A-C motor driven as a synchronous motor by the output of a frequency generator. The motor control circuit, including the frequency generator, energizes the A-C motor to initially cause the oscillating motion of the platform (chuck) carrying the substrate surface. After the initial time period of oscillating motion, the control circuit provides a high frequency signal to the motor for high speed rotation in one direction to produce a drying action to the thin, film-forming liquid. The particular motor construction provides mounting the substrate surface on a vacuum chuck with the output shaft holding the chuck provided with a liquid slinger to prevent excess production liquid from draining into the motor housing.

12 Claims, 11 Drawing Figures

APPARATUS FOR SPINNING A MICROELECTRONIC SUBSTRATE

This invention relates generally to an apparatus for and the method of achieving intimate contact between a liquid and a substrate which is to be wet by the liquid. More specifically, it relates to techniques wherein a dopant, chemical mask, or a film-forming liquid is initially applied to a wafer or the like and subsequently dried, with such techniques being most commonly employed in the art of making miniaturized electronic circuits.

In the art of making integrated circuits and the like, it is well known to provide a platform at the end of a shaft for holding a substrate, and also to provide a means for rotating the shaft after the substrate has been coated with a masking liquid. The whirling or spinning of the platform causes the liquid to be subjected to centrifugal forces, and produces a predictable profile in the dry film which is obtained when the liquid dries. Such films have found widespread use in the semiconductor industry because these films can be readily obtained in submicron thickness.

Prior to this invention, only three parameters were of significance in evaluating the spinners or whirlers that have been used to support and rotate the substrates; these three parameters were the eventual speed at which the platform (and the vacuum-held substrate) could be rotated, the stability with which that speed could be held, and the acceleration at which the platform could be brought up to speed. All of these parameters are concerned with taking a static substrate which has been flooded with a film-forming liquid and then promptly spinning it in one direction until it has dried to produce the desired film. It has now been found, however, that there are advantages to be gained by initially subjecting the liquid/substrate interface to one or more cycles of reciprocal motion prior to the rapid spin-up that is typical of past techniques.

In accordance with this invention, the platform is initially caused to rotate in a first direction, e.g., clockwise. Before the platform has had a chance to make even one complete revolution, however, it is brought to an abrupt halt and the direction of rotation is reversed. Again, before the platform has rotated a full revolution in a counter-clockwise direction, it is again jerked to a halt and the direction of rotation reversed. The cycles of rotation in a given direction and then the reverse direction are repeated as often as is deemed desirable, with each change in direction causing a shearing action between the liquid and the relatively moving platform. Obviously, the oppositely directed shearing forces that are realized are in a plane which is parallel to the substrate surface.

One object of the oscillatory motion which is obtained with this invention is that any minute bubbles of air which were initially trapped at the liquid/substrate interface are ripped loose and permitted to migrate to the surface of the liquid where they escape. This is a particularly significant result, because trapped air bubbles at the interface can cause ruinous pinholes in the dried film (which is typically only a few thousand Angstroms thick). While prior art systems provided only one major opportunity to shake loose any trapped air bubbles, said opportunity being the period during which the platform was accelerated from a static position, this invention provides as many opportunities as may be desired. A radical difference between this invention and those of the prior art can be seen when it is realized that prior systems had only a single direction of rotation; with this invention, it is possible to have varied cycles of reciprocal movement before a relatively long period of rotation at a high speed is effected. This high speed rotation dries the liquid and establishes the needed film thickness; such rotation typically is from 1500 rpm to about 12,000 rpm.

The significance of the oscillating movement to shake loose air bubbles can perhaps be best appreciated when it is realized that the final film thickness may range from a mere 2500 angstroms to 12,000 angstroms, while a typical air bubble may well have a diameter of 0.005 inch (1,200,000 angstroms). Such a bubble would be five to ten times the resolution that is frequently specified in the semiconductor industry for photolithographic work.

Too, stability in the rotating step is a major consideration in machine selection, and it is given the attention it deserves along with acceleration and speed.

The oscillating movement is also advantageous in loosening particulate contamination on the substrate, with common contamination being polishing grains, dust particles, lint, etc. Once such contaminants have been agitated and loosened, they are thrown off with the excess fluid. It is recognized that one hinderence in achieving repeatability of process steps in the past has been the lack of durability of the DC motors that have been used in the inherently hostile environments. By substituting a brushless AC motor for the DC motor of the past, the wear products of the previous carbon brushes are eliminated. Such wear products in the past have inevitably contaminated the interior of the motor, and they eventually migrate into the bearings of the rotor. In addition to destroying the bearings, carbon wear products can create low resistance paths from the brush housings to the case of the motor (ground); this can produce a short circuit, and has in many cases utterly destroyed the circuits in the motor controller. Also, the brushes of commercially available DC motors are usually sensitive to solvent contamination, and they tend to become soft and sometimes even dissolve as a result of contact with some of the fluids that are found in microelectronic photoresist production lines. Still another problem with brushes is the very strict requirement of concentricity of the commutator on which they ride. Even a very small deviation in the surface of the commutator frequently causes a brush to bounce up and down when the motor is turning at high speeds. Such bouncing causes arcing, burning of the brushes and of the commutator material, and can also cause wild signals to be thrown into the electronic feedback circuits; this usually causes oscillation of the motor which, in turn, can bring about destruction of the motor and possibly the electronic controls as well.

A further liability of commercially available DC motors for spinner applications is the high inertia of the rotating armature. Hence, considerable power inputs are required to accelerate the armature in the short time intervals that are desirable (e.g., 200 milliseconds). Too, any lack of symmetry in balance which may be caused by the many turns of wire must be avoided; this requires significant quality control to achieve the requisite symmetry, and correction of any imbalance is usually rather expensive. Wires have been known to tear loose, also; and a broken piece of wire being thrown off a rotor moving at 10,000 rpm can cause appreciable damage.

An AC motor with a permanent magnet overcomes all of these disadvantages in that it has no commutator, it has no wire on the rotating components and the operation is very smooth and quiet. The stator windings in an AC motor can be well impregnated for protection, and there is essentially nothing to wear out except possibly the bearings that support the rotor. Accordingly, it should now be apparent that a substantial improvement in spinner technology has been made available merely by providing a practical AC motor to replace the previously used DC motors.

A further advantage of the motor disclosed herein lies in the construction of the motor housing. As mentioned above, it is common to flood the water or substrate with liquid and permit any excess to passively drain off or be thrown off during initial movement of the platform. Any liquid that does not remain on the substrate flows over the edge of the platform and is usually collected in a pan or drum beneath the motor. Since the shaft of the motor of necessity has to be oriented in a vertical direction, the bearing between the fixed housing and the rotating shaft were typically exposed to physical contact with the excess liquids draining off the platform. Attempts were made in the past to design the vacuum chuck (which is attached to the top end of the shaft) so that excess production liquids could flow around but not into the motor housing. In practice, however, it has been found that some operators energetically remove the protective chuck and flush the entire apparatus with solvent when they are cleaning it. Without the vacuum chuck in place, these harsh cleaning fluids had direct access to the interior of the motor. Rotary seals between the shaft and the housing could not guard against such occasional misuse of the equipment since rotary seals were not available that could tolerate the high speeds of rotation (e.g., 12,000 rpm). Even Teflon seals with their low coefficient of friction and high heat tolerance were not an adequate solution. hence, there has been a long-felt need for some way to protect whirler motors during normal operation with a vacuum chuck installed, as well as during the occassional instances of operation when the vacuum chuck was removed. In accordance with this invention, a mechanical construction involving no physical contact between the shaft and the housing is provided to exclude liquids; this construction has no parts which are subject to wear, and which is not susceptible to failures of the past.

In view of the foregoing remarks, it will be apparent that it is an object of this invention to provide a new technique for obtaining highly predictable, unbroken, ultra-thin films.

Another object is to provide a two phase AC motor which is particularly useful in the practice of the invention.

Still another object is to provide a means for subjecting a liquid/substrate interface to repeated cycles of shear force in a known plane.

Yet another object is to foster the elimination of trapped air bubbles between a drop of liquid and its supporting substrate, whereby more intimate contact between the two is promoted.

These and other objects of the invention will be apparent from the specification and claims and from the attached drawings in which:

Figures 1, 2, 3, 8:
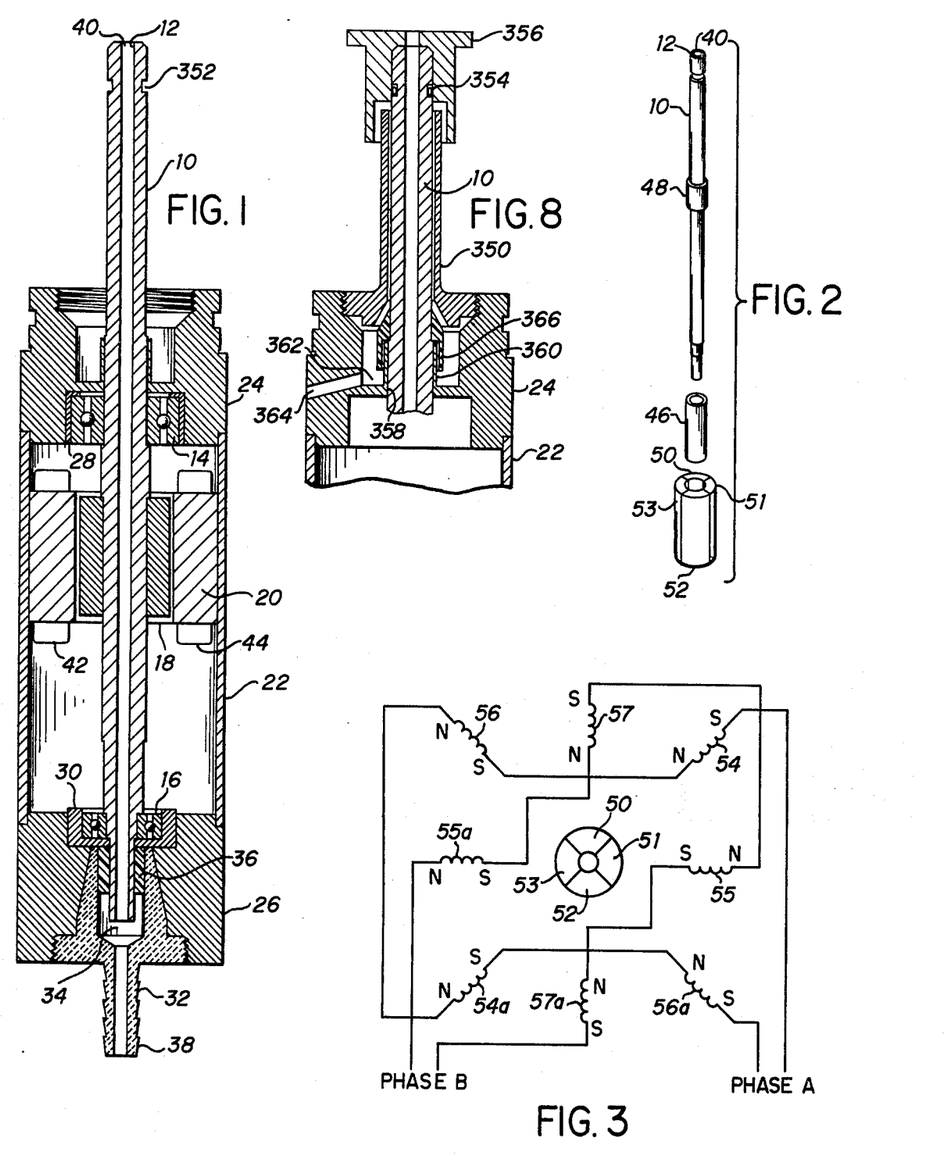
FIG. 1 is a cross section of a permanent magnet motor for driving a rotary table.
FIG. 2 is an exploded view of the permanent magnet rotor of the motor of FIG. 1.
FIG. 3 is a schematic of the motor field and permanent magnet rotor for two phase excitation.
FIG. 8 is a cross sectional view of the upper part of the permanent magnet motor of FIG. 1 detailing the vacuum chuck mounting and liquid draining construction.

Referring specifically to FIG. 1, a rotor shaft 10 is slotted, as at 12, to engage a fitting in a rotary table, which typically is a vacuum chuck. The substrate to be covered is placed on top of the chuck in a well known manner, and the photoresist material or other film-forming liquid is deposited on the substrate. The amount of liquid which is supplied is always more than is required in the dried film, and the excess that is not held on a rotating substrate by surface tension, adhesion or cohesion, is eventually slung off as the platform rotates. The initial depth of the liquid on top of a substrate is typically about 0.020 inch, but this controlled depth is strongly dependent on the known viscosity of the liquid. As illustrated, the rotor shaft 10 is supported in bearings 14 and 16 and supports a permanent magnet rotor 18 in a spaced relationship with a stator 20. Supporting the field 20 is a motor housing 22 enclosed by end bells 24 and 26. The top end bell 24 includes a bearing seat 28 into which the bearing 14 is fitted. At the bottom end bell 26 there is a bearing seat 30 into which the bearing 16 is fitted. Threaded into an opening of the end bell 26 is a vacuum line fitting 32 for applying a vacuum to a chamber 34. A rotating seal 36 surrounds the shaft 10 to provide a vacuum tight chamber. A vacuum source attached to the line 38 produces a vacuum at the opening 40 of the shaft 10 by means of an axial passage extending through the shaft into the chamber 34.

A rotating electric field is provided at the stator 20 by means of windings 42 and 44. Typically, the motor of FIG. 1 is a two-phase four pole AC motor. In one model of the motor constructed as shown, the stator 20 has twelve winding slots with a winding span of three slots. Excitation voltage for the windings 42 and 44 are supplied from a control circuit to be described.

Referring next to FIG. 2, there is shown an exploded view of the rotor of FIG. 1, including the shaft 10. Attached to the shaft 10 is a core 46 which is located on the shaft by an integral shoulder 48. Soldered to the core 46 are four quarter segment magnets 50–53. Each of these magnet segments is soldered to the core 46 and soldered to each other. Upon assembly of the quarter segment magnets 50-53 on the core 46, the assembly is press fit onto the shaft 10 and magnetized. Typically, the junctions between the magnets 50-51 and 52-53 are magnetized as a south seeking pole and the junctions between the magnets 51-52 and 50-53 are magnetized as a north seeking pole.

Referring to FIG. 3, with the rotor of FIG. 2 assembled into the motor configuration of FIG. 1 and magnetized as described, the motor may be schematically represented with the quarter segment magnets 50-53 positioned in field windings 54-57 and 54a-57a. As a two phase motor, the windings 55, 55a, 57 and 57a are connected in series to one source of energizing voltage, and the windings 54, 54a, 56 and 56a are connected in series to a second source of energizing voltage. For purposes of explanation, the windings 54, 54a, 56 and 56a will be designated as "phase A" and the windings 55, 55a, 57 and 57a will be designated as "phase B".

Figure 4A:
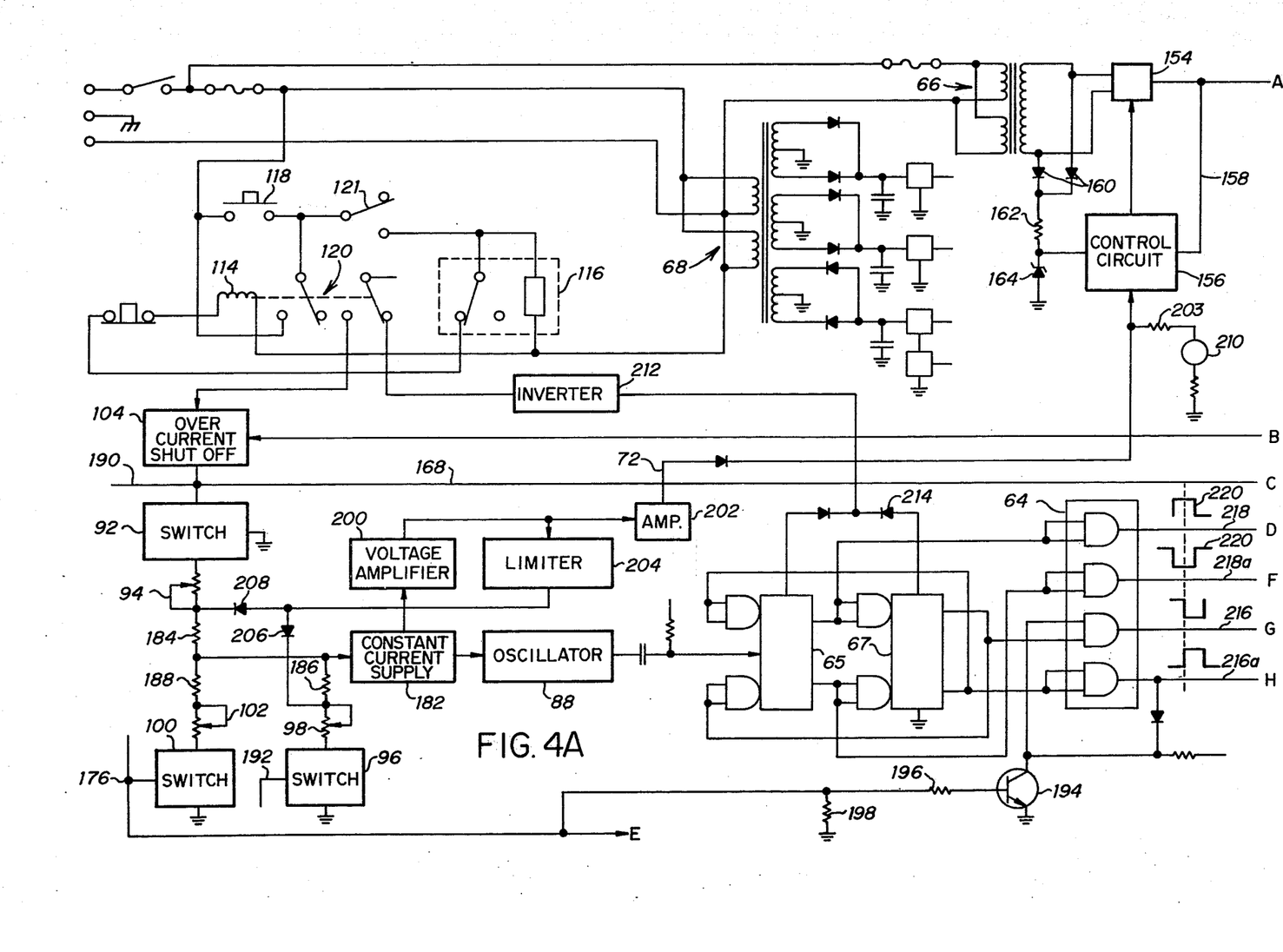
FIG. 4 is a block diagram of a circuit for imparting a shaking motion to the rotor of FIG. 1 during an initial time frame and a high speed rotation during a subsequent time frame.
Figure 4B:
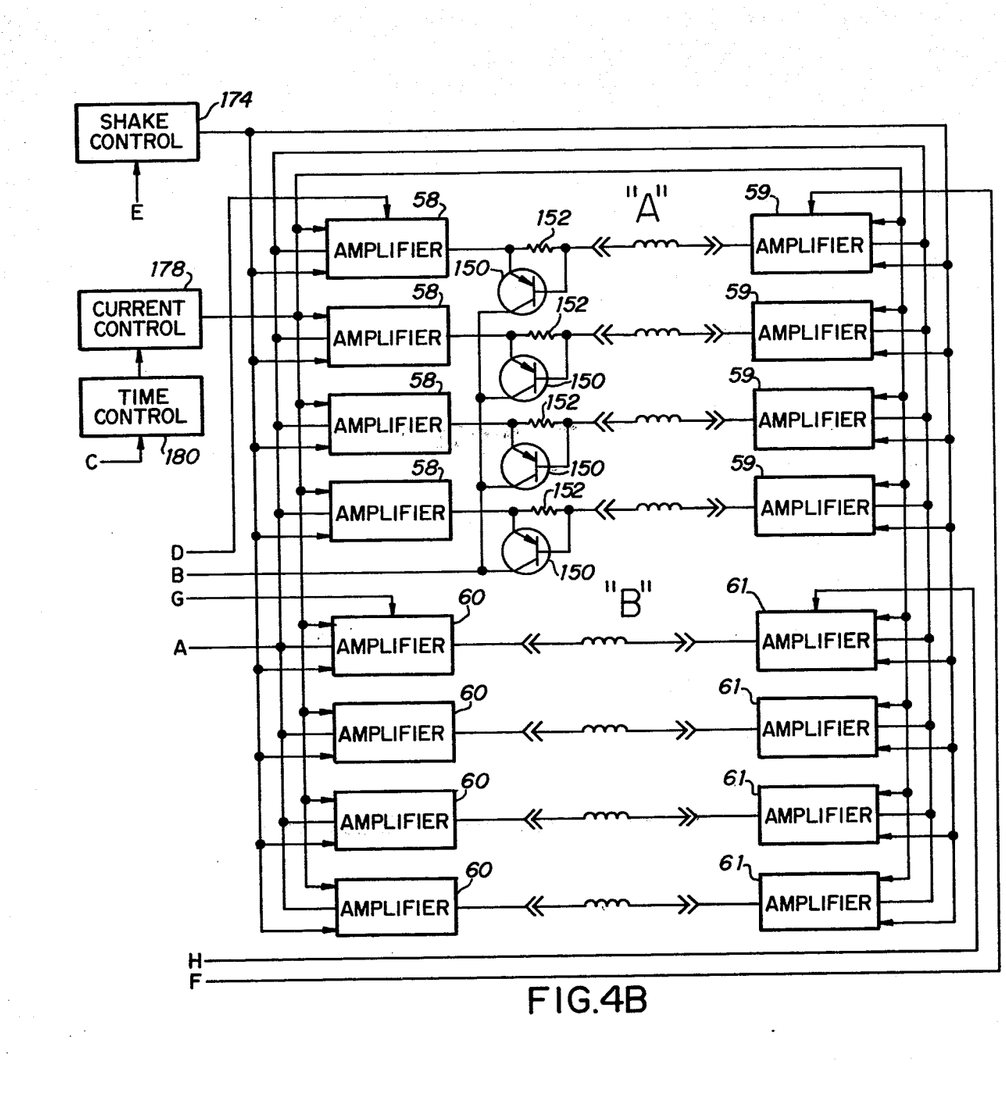

To energize the phase A and phase B windings and to generate a rotating field in the stator 20, windings 54, 54a, 56 and 56a are connected in series with a current sensing network including a transistor 150 and a resistor 152, and to the output of motor control amplifiers 58 and 59; and the windings 55, 55a, 57 and 57a are connected to the output of motor control amplifiers 60 and 61, as shown in FIG. 4. Each of the amplifiers 58 through 61 has one input connected to the output of a power supply 66. A second input to the motor control amplifiers 58 through 61 is a square wave voltage from an output of a two-phase generator consisting of an AND gate network 64 and flip-flops 65 and 67.

As illustrated, the circuit of FIG. 4 is connected to drive four separate permanent magnet motors, with each being of the type illustrated in FIG. 1. Thus, there are four motor control amplifiers 58 and 59, each coupled to the phase A windings of a motor, and four motor control amplifiers 60 and 61, each coupled to a phase B winding of a motor. The two-phase generator drives each of the motor control amplifiers 58-61 and the power supply 66 also couples to each motor control amplifier.

Power for energizing the control circuit is provided by power supplies 66 and 68. The power supply 68 generates the various transistor and amplifier biasing voltages as appearing on output lines A, B, C and D. The power supply 66 includes a silicon controlled rectifier output stage 154 controlled from a firing angle circuit 156. Input signals applied to the firing angle circuit 156 include a signal on line 72 representing the speed at which the motor 18 of FIG. 1 is controlled to run. Additional inputs to the circuit 156 include a feedback signal on line 158 and a biasing voltage as generated by a network including diodes 160, a resistor 162 and a Zener diode 164.

The power supply 66 provides an energizing voltage to each of the motor control amplifiers that varies from a low level for low speed motor operation to a higher level for high speed motor operation. Typically, the output voltage from the silicon controlled rectifier stage 154 varies from 10 volts for slow speed motor operation to 35 volts for high speed motor operation, as illustrated by the plot of applied voltage as a function of speed in FIG. 5.

A second control signal to the motor control amplifiers 58-61 is applied on line 75 and establishes the shake cycle (to be described) of the permanent magnet motors. This signal on line 75 is the output of a shake control amplifier 174 having an input equal to a shake voltage as applied to an input terminal 176. A third signal for establishing motor operation is applied to the motor control amplifiers 58-61 on a line 74. This signal on line 74 allows higher current to be supplied by the motor control amplifiers for a given time interval at the start of a motor cycle. A signal on the line 74 appears at an output of an acceleration current control amplifier 180. When a start signal is applied to the line 168, it starts a timing cycle in the control amplifier 180 to supply a signal voltage on line 74 for establishing a current level in the motor windings.

Figure 6:
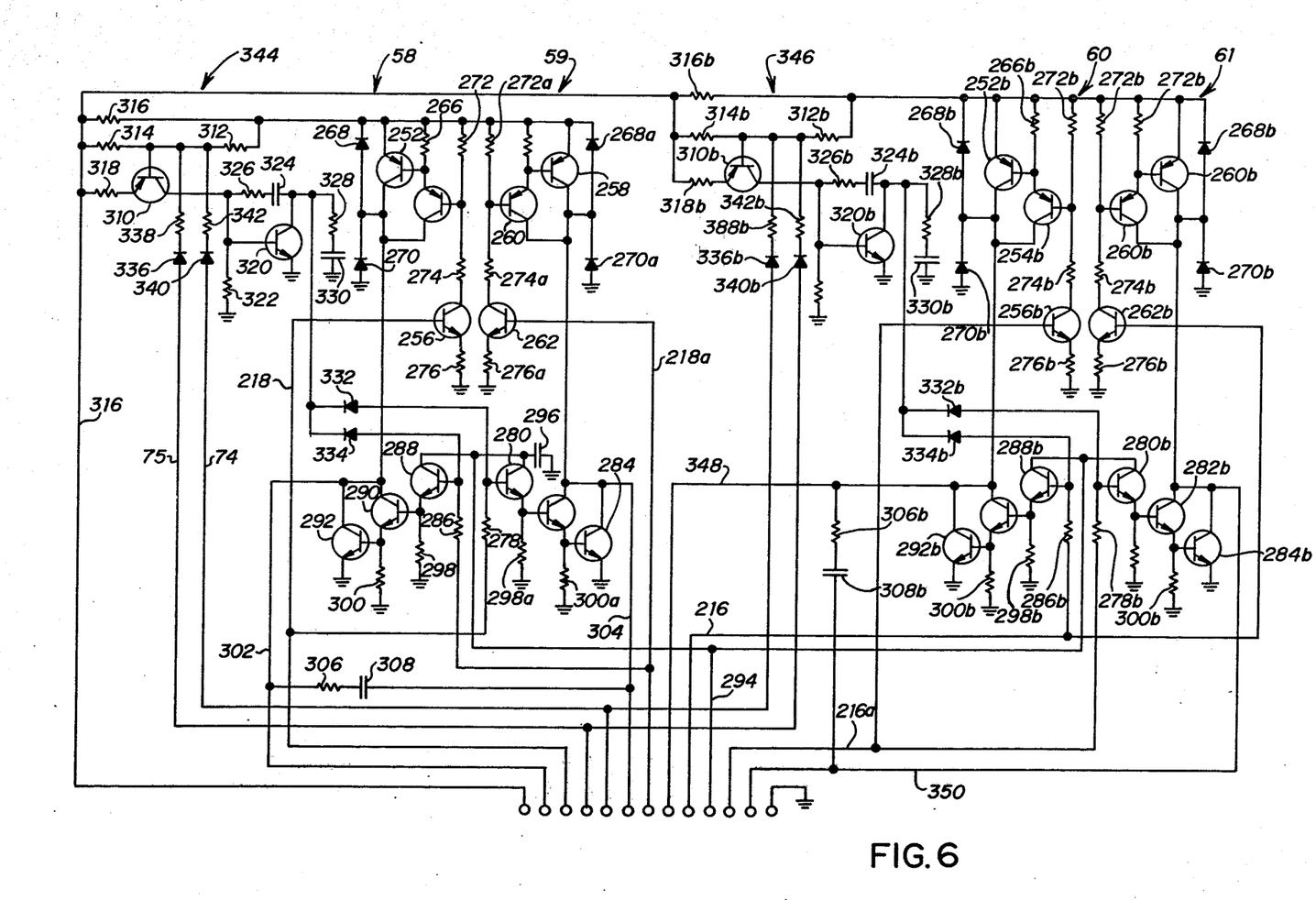
FIG. 6 is a schematic of the motor control amplifiers of the circuit shown in block diagram in FIG. 4.

Referring to FIG. 6, there is shown schematically the motor control amplifiers 58-61 on a single printed circuitboard 250. Motor control amplifier 58 includes transistors 252, 254 and 256. Differentially coupled to the output of the AND gate network 64 with the amplifier 58 is the motor control amplifier 59 comprising transistors 258, 260 and 262. The transistors 252 and 258 provide high impedance coupling between a power supply connected to line 264 and transistors 254 and 260, respectively. To complete the high impedance circuit for the transistor 254, a resistor 266 also connects to the line 264 and the junction between the base of transistor 252 and the emitter of transistor 254. Diodes 268 and 270 connect to the collector electrode of the transistors 252 and 254. A base drive circuit for the transistor 254 includes resistors 272 and 274, the latter connected to the collector electrode of the transistor 256. Transistor 256 connects to ground through a resistor 276.

The motor control amplifier 59 includes diodes 268a and 270a along with resistors 266a, 272a, 274a and 276a. Each of these components is similar to the like numbered parts (without the letter identification) found in the amplifier 58.

Transistor 256 includes a base electrode tied to the line 218 from the output of the AND gate network 64. Line 218 also connects through a resistor 278 to the base electrode of a transistor 280 as part of a current regulating circuit including additional transistors 282 and 284. Transistor 262 of the amplifier 59 has a base electrode tied to a line 218a of the AND gate network 64. Line 218a connects through a resistor 286 to the base electrode of a transistor 288 as part of a current regulating circuit including transistors 290 and 292.

Each of the current regulating circuits is similar. Transistors 280 and 288 have a common connection between collector electrodes tied to a power supply voltage applied to line 294. A capacitor 296 provides an AC path to ground from the collector electrode of the transistors 280 and 288. The emitter electrode of the transistor 288 is tied to the base electrode of the transistor 290 and to a resistor 298. Transistor 290 includes an emitter electrode tied to the base electrode of the transistor 292 and to a resistor 300. Transistor 292 has an emitter electrode tied to ground. Transistors 290 and 292 have a common collector connection tied to the collector electrodes of the transistors 252 and 254. This interconnection ties to a line 302 coupled to the phase A windings of the permanent magnet motor 18.

Transistor 280 of the second current regulating circuit includes an emitter electrode tied to the base electrode of the transistor 282 and to a resistor 298a. Transistor 282 includes an emitter electrode tied to the base electrode of the transistor 284 and a resistor 300a. Transistor 284 has an emitter electrode tied to ground.

Transistors 282 and 284 have a common collector connection to the collector electrodes of the transistors 258 and 260. This interconnection is tied to a line 304 coupled to the phase A windings of the permanent magnet motor 18.

A phasing circuit including a resistor 306 in series with a capacitor 308 interconnects between the lines 302 and 304. This circuit then parallels the phase A winding of the motor.

In addition to the pulse output signals from the AND gate network 64, there are three different signals controlling the current regulator in each of the motor control amplifiers 58 and 59. A first of these inputs is a running current control signal that adjusts the running current through the motor windings. This signal is generated by a current control circuit 344 including a transistor 310 having a base electrode coupled to the line 264 through a resistor 312. Also tied to the base electrode of the transistor 310 is a resistor 314 connected to a line 316 from a power supply. A current sense resistor 316 is connected in parallel with the resistors 312 and 314 and provides a measure of the current to the phase A windings. The output circuit of the transistor 310 includes a resistor 318 coupled to the emitter electrode and a transistor 320 having a base electrode tied to the collector electrode of the transistor 310. Transistor 320 includes a base circuit of a resistor 322. The collector electrode circuit of the transistor 320 consists of a capacitor 324 in series with a resistor 326. Also tied to the collector electrode of the transistor 320 is a resistor 328 in series with a capacitor 330. A signal generated at the collector electrode of the transistor 320 is applied to the base electrode of the transistors 280 and 288 through diodes 332 and 334, respectively.

The second control signal to the current regulator circuit of the motor control amplifiers 58–61 is the shake current signal on line 75 coupled to the base electrode of the transistor 310 through a circuit including a diode 336 and a resistor 338. The third signal for establishing motor operation is applied on the line 74 to establish an acceleration current signal and connects to the base electrode of the transistor 310 through a circuit including a diode 340 and a resistor 342.

In operation of the amplifiers 58 and 59 and the current control circuit 344, the pulse outputs of the AND gate network 64 on the lines 218 and 218a provide differential operation of the amplifiers 58 and 59. When the amplifier 58 is conducting to establish the upper voltage limit applied to the phase A windings, the amplifier 59 is nonconductive and the current regulator circuit associated therewith establishes the lower voltage limit applied to the phase A windings. For example, driving the transistor 256 establishes the upper voltage signal at the collector electrode of the transistor 254 and at the same time driving the transistor 280 establishes the lower voltage level applied to the phase A windings. This, in effect, establishes the voltage differential across the lines 302 and 304 thereby controlling both the voltage and current levels to the phase A windings.

When the outputs of the two-phase generator on lines 218 and 218a reverse direction, then the transistor 262 establishes the upper voltage limit applied to the phase A windings and the transistor 288 and associated circuitry establishes the lower voltage level applied to the phase A windings. This also then establishes the voltage differential across the lines 302 and 304 with the line 304 in this instance at the higher voltage level.

The current control circuit 344 varies the lower level voltage applied to the phase A windings in accordance with the current through the resistor 316 and the signals applied to either line 74 or 75. By varying the base drive to the transistors 280 and 288, the lower voltage level is varied to establish a desired current across the phase A windings.

With regard to the phase B windings, the amplifiers 60 and 61 are also shown in FIG. 6 along with a current control circuit 346. Each of these circuits is identical with the corresponding circuit in the left half of FIG. 6. That is, the amplifier 60 is the same as the amplifier 58, the amplifier 61 is the same as the amplifier 59 and the current control circuit 346 is the same as the current control circuit 344. The various components of the right hand circuits have been identified with the same reference numerals followed by the further identifier of a lower case *b*. Thus, transistor 256 of amplifier 58 is the same as transistor 256b of amplifier 60.

The collector interconnection of transistors 252b, 254b, 290b and 292b connects to a line 348 coupled to the phase B windings of the permanent magnet motor 18. The common collector connection of the transistors 258b, 260b, 282b and 284b is tied to a line 350 also tied to the phase B windings of the permanent magnet motor. The phasing circuit of resistors 306b and 308b connects between the lines 348 and 350 and is in parallel with the phase B windings of the motor. Operationally, the motor control amplifiers 60 and 61 and the current control circuit 346 is the same as explained previously with regard to the motor control amplifiers 58 and 59 and the current control circuit 344. The base electrode of the transistors 262b and 288b are driven by the output of the line 216 from the AND gate network 64. Transistors 256b and 280b are driven by the signal on line 216a from the network 64. The difference in the operation between the phase A and phase B windings is found during the shake cycle as will be explained.

In one working model of the circuitry of FIG. 6, the transistor and diode identifiers are given in Table I and the resistor and capacitor values are also as given in Table I. Each of the components of FIG. 6 with the same reference number (followed by either *a* or *b*) will be as given in Table I.

TABLE I

| TRANSISTOR | IDENTIFIER |
| --- | --- |
| 252, 258 | 2N5195 |
| 254, 260 | MPSU56 |
| 256, 262 | MPSU06 |
| 288, 280 | 2N3903 |
| 290, 282 | 2N5192 |
| 292, 284 | 2N3055 |
| 310 | MPSU56 |
| 320 | 2N3903 |
| DIODE | IDENTIFIER |
| 268 | 1N5404 |
| 270 | 1N5404 |
| 332 | 1N914 |
| 334 | 1N914 |
| 336 | 1N4004 |
| 340 | 1N4004 |
| RESISTOR | VALUE |
| 266 | 33Ω |
| 272 | 1K |
| 274 | 470Ω 1w |
| 276 | 150Ω |
| 286 | 4.7K |
| 298 | 4.7K |
| 300 | 33Ω |
| 306 | 33Ω |
| 312 | 316Ω 1% |

TABLE I-continued

| TRANSISTOR | IDENTIFIER |
|---|---|
| 314 | 511Ω 1% |
| 316 | 1Ω 10w |
| 318 | 220Ω |
| 322 | 82K |
| 326 | 2.25 |
| 328 | 220Ω |
| 338 | 162Ω 1% |
| 342 | 162Ω 1% |
| CAPACITOR | VALUE |
| 308 | .047μf |
| 324 | .0047μf |
| 330 | .0047μf |

To select a particular operating condition for the motors energized from the output of the motor control amplifiers 58–61, the flip-flop 65 of the two-phase generator connects to the output of a unijunction oscillator 88 having an input from a constant current supply 182. To control the unijunction oscillator 88, the constant current supply 182 has three control circuits connected to an input thereof. One of the control circuits to the supply 182 consists of a transistor switch 92 in series with a variable resistor 94 and a fixed resistor 184. A second control circuit includes a transistor switch 96 in series with a variable resistor 98 and a fixed resistor 186. The third control circuit includes a transistor switch 100 in series with a variable resistor 102 and a fixed resistor 188.

Control of the transistor switch 92 is by a "speed 1" input signal as applied to a line 190. The transistor switch 92 is also controlled by the output of an over-current shutoff circuit 104 having an input tied to one side of a double-pole, double-throw switch 120. The transistor switch 96 is closed by application of a "speed 2" signal applied to an input line 192. A "shake" input signal applied to the terminal 176 controls the transistor switch 100 and also provides a base drive voltage to a lockswitch transistor 194 through a biasing network of resistors 196 and 198. Operation of the lockswitch transistor 194 will be explained.

To provide a linear frequency increase at the output of the unijunction oscillator 88, the constant current supply 182 has a second output connected to a voltage amplifier 200. Amplifier 200 imparts a gain of four to the output of the constant current supply 182 and this amplified signal is applied to one input of a tachometer amplifier 202 and an input of a voltage rate of change limiter 204. A positive output from the change limiter 204 controls the turn-on of the constant current source 182 through diodes 206 or 208. Thus, the output of the constant current supply as applied to the unijunction oscillator 88 is controlled by one of the transistor switches 92, 96 or 100 and the output of the rate of change limiter 204. This provides a linear frequency increase at the output of the oscillator 88 at a rate set by the limiter 204.

To limit the maximum amount of power, and to limit the power normally dissipated by the current limiting transistor 150, the power supply 66 is a "swinging" power supply which tracks the frequency of the oscillator 88 as established by one of the potentiometers 94, 98 or 102 and the current source 182. This is accomplished by connecting the output of the tachometer amplifier 202 to one input of the firing angle control circuit 156 which fires the silicon controlled rectifiers of the stage 154. This provides a swinging power supply to vary the output as explained previously. A measure of the motor speed is indicated on a tachometer 210 coupled to the output of the amplifier 202 through a resistor 203.

Reset control for each of the flip-flops 65 and 67 is provided by a reset inverter 212 coupled to diodes 214 and having an input connected to a terminal of the switch 12.

The program for operating the permanent magnet motors is initiated after vacuum has been manually applied to the vacuum chuck, thereby closing the vacuum-sense switch 121. The operator then pushes the start button 118 to energize a timer 116. Upon completion of the timing cycle for the timer 116, a circuit is established to energize a relay coil 114 to move the switch 120 from the position illustrated to a position for establishing a holding circuit for the coil 114 and applying a DC voltage to the over-current shutoff circuit 104 to close the transistor switch 92. During this timing cycle for the timer 116, the permanent magnet motor 18 is operated through a shake cycle by application of a voltage to terminal 176.

In operation of the shake cycle, initially the field windings 54, 54a, 56 and 56a are energized to rotate the rotor 18 in an oscillatory motion of about one-quarter of a revolution. During this initial "shake" operation, the windings of phase B (i.e., windings 55, 55a, 57 and 57a) are energized with a DC voltage to provide a locking field to lock the rotor in an orientation as illustrated in FIG. 3. This period of DC energization is shown by curve 124 of FIG. 7. The DC voltage for energizing the windings 55, 55a, 57 and 57a is generated at the output lines 216, 216a of the AND gate network 64. During this initial shake period, the windings of phase A (i.e., windings 54, 54a, 56 and 56a) are energized by a relatively high frequency square wave voltage. This voltate is generated at the lines 218, 218a of the network 64 as connected to the differential amplifiers 58 and 59.

To generate this relatively high frequency, square wave voltage, a signal is applied to the terminal 176 to control the transistor switch 100. This establishes a preset resistance level to the input of the current supply 182 to produce a high frequency train of output pulses at the oscillator 88 to control the flip-flop 65. The voltage applied to the windings 54, 54a, 56 and 56a during the shake period is illustrated by curve 126 of FIG. 7. At the same time, the signal on terminal 176 turns on the lockswitch transistor 194 to clamp the output voltage on lines 216, 216a to a low DC level.

Figure 5:
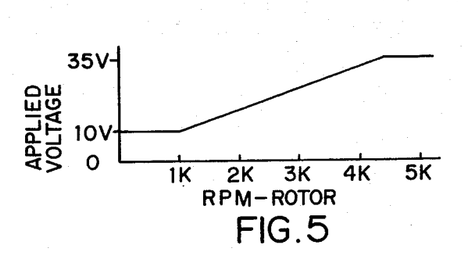
FIG. 5 is a plot of voltage as a function of speed showing the variation of motor energizing voltage for various speeds thereof.

To further explain the operation, let it be assumed that at time zero the pulses shown at 220 are generated on the output lines 218, 218a and applied to one input of the amplifiers 58 and 59. This establishes a south-seeking pole at the windings 54 and 54a and a north-seeking pole at the windings 56 and 56a, thereby causing the rotor 18 to begin to rotate clockwise and overcoming the magnetic force of the locking windings 55, 55a, 57 and 57a. However, just before the rotor has rotated about 45°, the phase 1 output (on lines 218, 218a) of the network 64 switches polarity and the magnetic polarity of the windings 54, 54a, 56 and 56a reverses. This causes the rotor to suddenly reverse its direction of rotation and to swing back toward its initial position; it will swing past its initial "locked" position and continue toward a new objective which is located in the opposite direction from its first objective. Again, before the rotor has rotated about 45°, the phase 1 output of the network 64 changes polarity; this reverses the magnetic attraction and the rotor 18 switches back to its initial direction of rotation. This oscillating motion continues until a time $t_1$, when the timer 116 times out and energizes the relay coil 114. As illustrated in FIG. 5, the rotor 18 changes direction eight times from time $t_0$ to time $t_1$.

At time $t_1$, a control voltage is applied to the transistor switch 92 and the unijunction oscillator 88 generates a second output frequency and the lockswitch transistor 194 is turned off to unclamp the output on lines 216,216a. Initially after time $t_1$, the first pulse output at phase 1 of the network 64 has a period of about 13 milliseconds. If during this initial period after time $t_1$, phase 1 of the network 64 has a "positive" output voltage, then phase 2 provides a "negative" output voltage to the amplifiers 60 and 61. This is shown by curve 124 of FIG. 7. The period of this first negative pulse for phase 2 is regulated to be about one-half the period of the phase 1 pulse. This establishes a 90° phase differential between the phase A windings and the phase B windings, thus establishing a rotating magnetic field at the stator 20.

Figure 7:
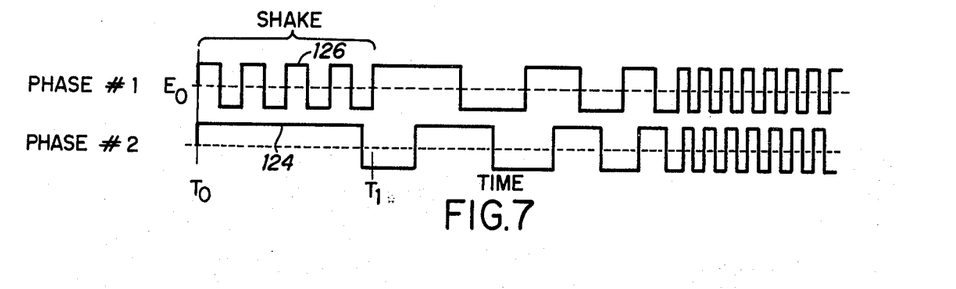
FIG. 7 is a series of waveforms showing the excitation state of the field windings during the shake and run time frames.

The period between the first and second cycle after time $t_1$ must be approximately (or a little less) than the time required (e.g., 13 milliseconds) for the rotor 18 to rotate 45° from an initially excited standstill position. To finally accelerate the rotor to the desired running speed, the rate of change limiter provides a control voltage to the current supply 182 to generate a linearly increasing frequency to the flip-flop 65. This is illustrated in FIG. 7 by the decreasing period of each successive pulse for the curves 124 and 126 following time $t_1$. Typically, the rotor may be brought up to a desired running speed (e.g., 12,000 rpm) in a time ranging from 90 milliseconds to 1.2 seconds or greater. By increasing the size of the magnet and the length of the stator, faster acceleration and higher torque loads can be obtained. The design of the housing 22 is such as to readily accomodate magnets having a length of up to 2 inches. Manufacturing economy is thus achieved by producing one housing which can accomodate magnets which are, say, 1.0, 1.5 and 2.0 inches long.

The rotor 18 continues to rotate at a speed determined by the frequency of the square wave voltages applied to phases A and B. In this respect, the motor of FIG. 1 operates as a synchronous motor and has the speed-torque characteristics thereof. That is, the rotor of each of a plurality of motors will operate at a synchronous speed with the frequency of the signal applied to the phase A and phase B windings. If the torque on any one of the motors should then reach some maximum value, then that motor simply stops. Stopping one or more of a plurality of synchronous motors causes no damage to any part of the control circuit. If one of a plurality of motors should be disconnected, the remaining motors could be operated, run, stopped, started, etc., indefinitely.

To operate the motor at a second, higher speed than that controlled by the transistor switch 92, a signal is applied to the line 192 to control the switch 96. This provides a different current signal to the oscillator 88 to change the clock frequency applied to the network 64.

After the rotor 18 has attained its designed operation speed, the current applied to the windings 54–57 and 54a–57a is controlled by current sensors and the current control circuits 344 and 346. During acceleration, the initial value of the current to the motors 18 is determined by a control signal on line 74. As an example, during acceleration of the rotor from its speed at time $t_1$ to the designed operating speed, the current regulator circuits of the motor control amplifiers generates a signal to provide 1 ampere/phase to the field windings. After this preset acceleration time, the current is regulated to a lower value for maximum motor efficiency. During the running cycle, each phase of the motor is typically energized with one-half ampere. During the shake cycle from time $t_0$ to time $t_1$, the current supplied equals approximately 1 ampere/phase by a signal on line 75. This figure and those given above are examples for a motor with a 1 inch stator length (and magnet length) with 30 turns per field coil of No. 25 wire, and 6 coils per phase. Such a motor has a designed operating speed of 12,000 rpm.

Referring now to FIG. 8, the motor housing includes a stator housing 22 in which the coils are permanently mounted. For convenience in manufacturing, the stator housing 22 is initially open at both ends, and is provided with two end caps which are referred to (according to their orientation when installed) as the top cap and the bottom cap. The top cap is itself conveniently fabricated in two pieces which are later joined; for clarity, the piece which is typically attached to the stator housing 22 by bolts is called the end bell 24, and the piece which is shown as threadedly attached to the end bell is called the shaft protector stem 350. A groove 352 for an O-ring 354 or the like is provided near the upper end of the rotor shaft 10, and an O-ring in that groove provides a sealing means between the shaft and the vacuum chuck 356. The shaft protector stem 350 extends well under the vacuum chuck 356 for a distance which is adequate to prevent the entrance of any of the production liquids into the stator housing.

The end bell 24 is provided with an aperture 358 through which the rotor shaft 10 extends; this aperture is surrounded by an upstanding lip 360. Outwardly from the aperture 358 and from the lip 360 is a trough or groove 362 that extends completely around the aperture. For compactness, the upstanding lip 360 advantageously constitutes a wall in common between the aperture 358 and the trough 362. A passage 364 is also provided in said end bell 24 for the purpose of draining to the housing exterior such liquids as may be captured in the trough.

With the vacuum chuck 356 in its normal position, there is no way that production liquids could be forced up and over the protector stem 350 where they might have an opportunity to reach the motor interior. If the vacuum chuck 356 is removed, and a cleaning solvent were to be deliberately poured around the stem 350 and shaft 10, it is true that some of the solvent would probably enter the exposed end of the stem; but even such a zealous attempt by an operator to bathe everything (including the motor interior) with a cleaning solvent will be thwarted by shield or skirt 366 which is attached to the shaft 10 internally of the housing. The shield 366 is preferably made of a light weight plastic material such as Delrin; hence it adds little to the inertia of the stainless steel shaft. The shield 366 is manufactured with an internal diameter which provides at least a force fit on the shaft 10; as such, it may properly be described as being sealingly attached to the shaft. In its installed position on the shaft 10 and deep within the housing, the shield extends radially outward over the upstanding lip 360 and — depending on the vertical length of the shield — can also extend down into the trough 362. In this preferred embodiment, the shield 366 is illustrated as rather long; but while such length provides great reliability, it is not mandatory, especially since the slinging action of the rotating shield tends to throw any liquid well away from the aperture 358 and toward the outer wall of the trough. Any liquids that should happen to enter the protector stem 350 will follow a harmless flow path including movement partially down the shaft, radially off the shield and into the trough 362, and through the passage 364 from the trough to the exterior of the stator housing.

Figure 9:
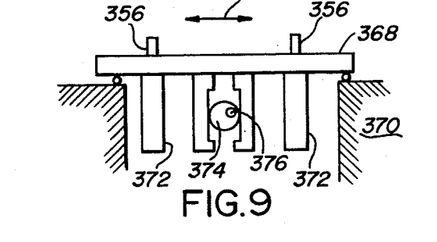
FIG. 9 is an alternate embodiment for achieving the desired reciprocal shearing action in the forming of thin films.

Referring next to FIG. 9, an alternate embodiment for achieving the desired reciprocal shearing action is shown schematically. Two of a plurality of motors are shown attached to a table 368 which is mounted on a fixed structure 370. The motors 372 may be structurally the same as those previously disclosed, although it is possible to make the electrical control circuit much simpler in this embodiment. An eccentric drive wheel 374 is caused to rotate by rotating the shaft 376 with any well known means such as an electric motor. As the eccentric drive wheel 374 makes repeated revolutions, the table 368 is caused to reciprocate in the plane represented by the double-headed arrow 378; said plane is, of course, parallel to the plane of substrate/liquid interface. Thus, when the table 368 reciprocates, the substrate/liquid interface is subjected to repeated cycles of shear forces in a first and then an opposite direction. This first step of shaking of the table 368 occurs for as long as is desired, and then the motors 372 are activated and the substrates are accelereated in a single direction as has been common in the past.

Figure 10:
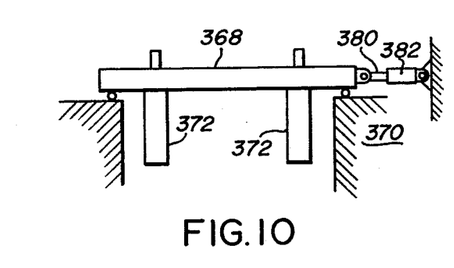
FIG. 10 is a modification of the embodiment of FIG. 9 illustrating additional apparatus for imparting reciprocating motion to a platform holding a substrate surface.

Another embodiment is schematically illustrated in FIG. 10, wherein a reciprocating piston 380 within a cylinder 382 is driven to provide the motive power to reciprocate the table 368 prior to rotation of the substrates. Of course, either hydraulic, pneumatic, piezoelectric or pure mechanical means may be employed to shake the entire table 368 or selected portions thereof. Also, ropes, chords, chains or cables may be employed to connect the table to the driver, rather than a rigid bar.

It should perhaps be pointed out that the apparent simplicity of the reciprocating apparatus shown in FIGS. 9 and 10 does not necessarily mean that such a system might be more readily employed than the system using AC motors as described herein-above. For one thing, any reciprocating movement along a straight line can impose rather severe loads on the rotary bearings that are used to spin the substrate after shaking the substrate has been completed. Since the substrate must be rapidly accelerated to a high speed (e.g., 100 milliseconds to 10,000 rpm), such requirements dictate that the inertia of the rotating parts of the system have a value as low as possible; this is not readily compatible with the strength requirements of the parts subject to repeated straight-line reciprocation. Hence, a compromise must be usually reached between the two anthical demands on the system.

While only one embodiment of the invention, together with modifications thereof, has been described herein and shown in the accompanying drawings, it will be evident that various further modifications are possible without departing from the scope of the invention.

What is claimed is:

1. Apparatus for spinning a microelectronic substrate, comprising:
    a base for receiving and holding said substrate,
    a two-phase motor having a first winding and a second winding and including a rotor coupled to said base, and
    a control circuit including means for initially applying a phase reversing, low frequency voltage to the second winding of said motor and a DC voltage to the first winding to generate a reversing magnetic field and impart an oscillatory motion to the rotor, said control circuit further including means for timing the oscillatory motion of the rotor and applying a high frequency running voltage to the first and second windings to generate a revolving magnetic field to impart a rotating motion to said base.

2. Apparatus for spinning a microelectronic substrate as set forth in claim 1 wherein said two-phase motor includes a permanent magnet rotor.

3. Apparatus for spinning a microelectronic substrate as set forth in claim 2 wherein said permanent magnet rotor comprises four quarter magnet segments assembled and magnetized as alternate north and south seeking poles.

4. Apparatus for spinning a microelectronic substrate as set forth in claim 1 wherein said means for initially applying a phase reversing, low frequency voltage to the second winding and a DC voltage to the first winding includes a two-phase generator having one output for energizing the first winding and a second output for energizing the second winding.

5. Apparatus for spinning a microelectonic substrate as set forth in claim 4 wherein said control circuit includes a variable frequency clock for applying a control signal to an input of said two-phase generator.

6. Apparatus for spinning a microelectronic substrate as set forth in claim 5 including means for controlling the variable frequency clock to vary the output frequency of the two-phase generator, and said means for timing the oscillatory motion of the rotor connects to said means.

7. Apparatus for spinning a microelectronic substrate as set forth in claim 1 wherein said control circuit includes means for controlling the current level of the first and second windings of said two-phase motor.

8. Apparatus for spinning a microelectronic substrate, comprising:
    a base for receiving and holding said substrate,
    a two-phase motor having a first winding and a second winding and including a permanent magnet rotor with a shaft coupled to said base,
    amplifier means connected to the first winding and the second winding of said motor for initially applying a phase reversing, low frequency voltage to the second winding and a DC voltage to the first winding to generate a reversing magnetic field and impart an oscillatory motion to the rotor,
    a two-phase generator having one output connected to said amplifier means for energizing the first winding and a second output connected to said amplifier means for controlling the energization of the second winding,
    a variable frequency clock for applying a control signal to an input of said two-phase generator, and
    timing means connected to the variable frequency clock for timing the oscillatory motion of the rotor through said two-phase generator and said amplifier means and for applying a high frequency running voltage through said amplifying means to the first and second windings to generate a revolving magnetic field and impart a rotating motion to said base.

9. Apparatus for spinning a microelectronic substrate as set forth in claim 8 wherein said permanent magnet rotor comprises four quarter magnet sections assembled and magnetized as alternate north and south seeking poles.

10. Apparatus for spinning a microelectronic substrate as set forth in claim 8 including means connected to said amplifier means for controlling the current level of the first and second windings of said two-phase motor.

11. Motor apparatus comprising:
a shaft adapted to rotate freely in either direction,
magnetic means rigidly attached to said shaft for rotation therewith,
first and second elements spaced peripherally about said shaft and located adjacent the plane in which the magnetic means is adapted to rotate including a first field coil associated with said first element and a second field coil associated with said second element, and
means for energizing said first and second field coils for causing said magnetic means to be alternately attracted to the first and then the second elements, thereby to cause oscillating motion between positions approximately corresponding to the location of the first and second elements.

12. Motor apparatus as set forth in claim 11 wherein said means for energizing said first and second field coils includes means for energizing said coils to cause the magnetic means on said shaft to be subjected to a rotating magnetic field in a single direction.

* * * * *